United States Patent [19]
Yew et al.

[11] Patent Number: 5,960,299
[45] Date of Patent: Sep. 28, 1999

[54] METHOD OF FABRICATING A SHALLOW-TRENCH ISOLATION STRUCTURE IN INTEGRATED CIRCUIT

[75] Inventors: Tri-Rung Yew, Hsinchu Hsien; Water Lur; Shih-Wei Sun, both of Taipei, all of Taiwan

[73] Assignee: United Microelectronics Corp., Hsinchu, Taiwan

[21] Appl. No.: 09/181,466

[22] Filed: Oct. 28, 1998

[51] Int. Cl.$^6$ ............................... H01L 21/76
[52] U.S. Cl. ............... 438/424; 438/435; 438/437; 438/296; 148/DIG. 50
[58] Field of Search .................. 438/424, 427, 438/435, 437, 296; 148/DIG. 50

[56] References Cited

U.S. PATENT DOCUMENTS

| | | | |
|---|---|---|---|
| 5,447,884 | 9/1995 | Fahey et al. | 148/DIG. 50 |
| 5,492,858 | 2/1996 | Bose et al. | 148/DIG. 50 |
| 5,763,315 | 6/1998 | Benedict et al. | 438/435 |
| 5,786,262 | 7/1998 | Jang et al. | 148/DIG. 50 |
| 5,858,858 | 1/1999 | Park et al. | 438/424 |

*Primary Examiner*—Trung Dang
*Attorney, Agent, or Firm*—Thomas, Kayden, Horstemeyer & Risley, L.L.P.

[57] ABSTRACT

A semiconductor fabrication method is provided for fabricating a shallow-trench isolation (STI) structure in an integrated circuit, which can prevent the occurrence of microscratches in the oxide plugs of the STI structure, thus further preventing the occurrence of a bridging effect and short-circuits between the circuit components that are intended to be electrically isolated by the STI structure. This method is characterized by the use of a laser annealing process to remove the microscratches that formed on the top surface of the oxide plugs during the chemical-mechanical polishing (CMP) process used to remove the upper part of the oxide layer to form the oxide plugs This method can therefore prevent the occurrence of a bridging effect and short-circuits due to the forming of the microscratches that would otherwise occur in the prior art.

11 Claims, 4 Drawing Sheets

5,960,299

METHOD OF FABRICATING A SHALLOW-TRENCH ISOLATION STRUCTURE IN INTEGRATED CIRCUIT

BACKGROUND OF THE INVENTION

1. Field of the Invention

This invention relates to semiconductor fabrication technologies, and more particularly, to a method of fabricating a shallow-trench isolation (STI) structure in integrated circuit that can prevent the STI structure from having microscratches and defects.

2. Description of Related Art

Isolation structures are formed in an integrated circuit for the purpose of preventing carriers from penetrating through the substrate to neighboring components. In a DRAM (dynamic random-access memory) device, for example, the FETs (field effect transistors) are isolated from each other by isolation structures so as to prevent charge leakage among the FETs. Conventionally, an isolation structure is formed by extending thick oxide layers beneath the substrate. One example of this technique is the so-called LOCOS (local oxidation of silicon) technique, which is widely utilized in the semiconductor industry to provide isolation structures among the various components on an IC device. However, the LOCOS technique still has some drawbacks, such as stress and bird's beak problems. The bird's beak problem is particularly undesirable since it can cause the isolation structures to be less effective when the IC device is further downsized for high integration.

One solution to the foregoing problem is to utilize the so-called shallow-trench isolation (STI) structure in place of the LOCOS structure. The method of forming STI structures includes the steps of performing an anisotropic etching process with a mask layer of silicon nitride to form shallow trenches at predefined locations, and then filling these trenches with oxide. One benefit of this method is that the topmost surface of the STI structure can be level with the topmost surface of the substrate.

FIGS. 1 through 5 are schematic, cross-sectional diagrams used to depict the steps involved in a conventional method for fabricating an STI structure in an integrated circuit. FIG. 6 is a schematic top view of the wafer of FIG. 5 (which is a cross-sectional view of FIG. 6 cutting through the line I—I in FIG. 6).

Referring first to FIG. 1, the STI structure is constructed on a semiconductor substrate 10, such as a silicon substrate. An oxide layer 22 is formed over the substrate to serve as a pad oxide layer for surface protection of the substrate 10. After this, a layer of silicon nitride layer 24 is formed over the oxide layer 22 Next, a photoresist layer 28 is formed over the silicon nitride layer 24, which is then selectively removed through a photolithographic and etching process to expose those regions where shallow trenches are to be formed. Subsequently, with the remaining photoresist layer 28 serving as a mask, an etching process is performed on the wafer, whereby those portions of the silicon nitride layer 24, the oxide layer 22, and the substrate 10 that are exposed by the photoresist layer 28 are etched away until reaching a predefined controlled depth in the substrate 10. Through this process, a plurality of shallow trenches 30 is formed in the substrate 10. After this, the entire photoresist layer 28 is removed.

Referring next to FIG. 2, in the subsequent step, a thermal oxidation process is performed on the wafer, whereby a liner oxide layer 31 is formed over the exposed surfaces of the trenches 30. Next, an APCVD (atmospheric-pressure chemical-vapor deposition) process is performed on the wafer, in which TEOS (tetra-ethyl-ortho-silicate) is used as the gas source, to thereby form a TEOS oxide layer 32 to a thickness above the silicon nitride layer 24. Subsequently, the TEOS oxide layer 32 undergoes a densification process at a temperature of about 1,000° C. for a duration of from 10 min. to 30 min. (minutes).

Referring further to FIG. 3, after the densification process, a CMP (chemical-mechanical polish) process is performed on the wafer until the silicon nitride layer 24 is exposed. Through this process, all the part of the TEOS oxide layer 32 that lies above the topmost surface of the silicon nitride layer 24 is removed, leaving only the part that is in the trenches 30. The part of the TEOS oxide layer 32 remaining after the CMP process then serves as TEOS oxide plugs in the trenches 30, which are here designated by the reference numeral 34. One drawback to the CMP process, however, is that it causes microscratches 25 on the TEOS oxide plugs 34 t , which are defects in the STI structure.

Referring further to FIG. 4, in the subsequent step, the silicon nitride layer 24 is entirely removed through an etching process. The etchant can be, for example, hot phosphoric acid.

Referring next to FIG. 5, in the subsequent step, an etching process is performed by submerging the entire wafer in a solution of hydrofluoric acid (HF). The HF solution can etch both the oxide layer 22 and the TEOS oxide plugs 34, but has a faster etching rate on the TEOS oxide plugs 34 than on the oxide layer 22. Therefore, when the oxide layer 22 is entirely etched away, the topmost surface of the remaining part of the TEOS oxide plugs 34 is nearly level with the topmost surface of the substrate 10. However, since the HF solution etches into TEOS oxide plugs 34 at a substantially equal etching rate in all directions, the part of the TEOS oxide plugs 34 remaining after the etching process still has microscratches 35 that are formed due to the existence of the original microscratches 25 shown in FIG. 4. As illustrated in the top view of FIG. 6, these microscratches 35 are scattered over the entire top surface of the TEOS oxide plugs 34 of the resultant STI structure. These microscratches 35 can cause the occurrence of a bridging effect or short-circuit between the circuit components that are intended to be electrically isolated by the STI structure. The yield rate of the IC manufacture is therefore low.

SUMMARY OF THE INVENTION

It is therefore the primary objective of the present invention to provide a new method for fabricating an STI structure in integrated circuit, which can prevent the occurrence of microscratches in the oxide plugs of the STI structure, thus further preventing the occurrence of a bridging effect and short-circuit between the circuit components that are intended to be electrically isolated by the STI structure.

In accordance with the foregoing and other objectives of the present invention, a new method for fabricating an STI structure in an integrated circuit is proposed.

The STI structure is constructed on a semiconductor substrate. By the method of the invention, a mask layer is first formed over the substrate, and then selected portions of the mask layer and the underlying substrate are removed to form a trench. Next, a thermal oxidation process is performed to form a liner oxide layer over the exposed surfaces of the trench. Subsequently, an oxide layer is formed over the mask layer, which fills the trench. Then, a CMP process is performed to remove part of the oxide layer until the mask layer is exposed, with the remaining part of the oxide layer in the trench serving as an oxide plug. It is a characteristic feature of the invention that in the subsequent step, a laser annealing process is performed on the oxide plug to remove all the microscratches formed on the top surface thereof. After this the entire mask layer is removed. Conventional processes are then performed to complete the fabrication of the IC device.

The foregoing method of the invention is characterized by the use of a laser annealing process to remove all the microscratches in the top surface of the oxide plugs that are caused by CMP process. The invention can therefore prevent the occurrence of a bridging effect and short-circuit due to the forming of the microscratches that would otherwise occur in the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 7 through 11 are schematic, cross-sectional diagrams used to depict the steps involved in the method of the invention for fabricating an STI structure in an integrated circuit that can prevent the occurrence of microscratches in the STI structure.

Figure 1:
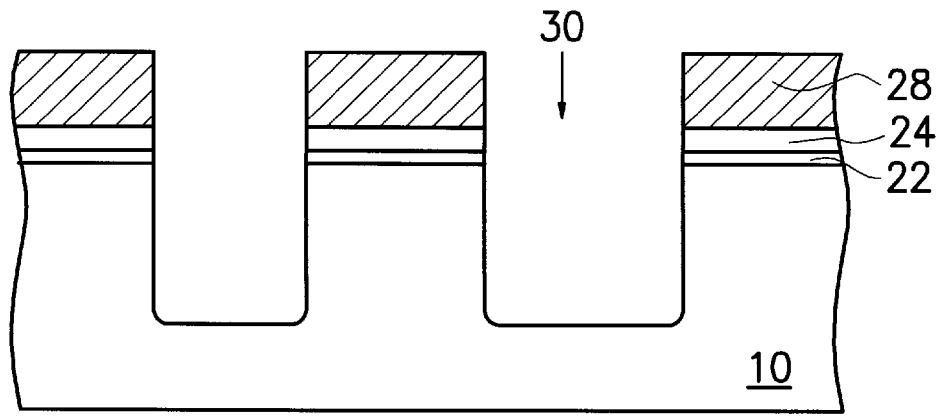
FIGS. 1 through 5 are schematic, cross-sectional diagrams used to depict the steps involved in a conventional method for fabricating an STI structure in an integrated circuit.
Figure 2:
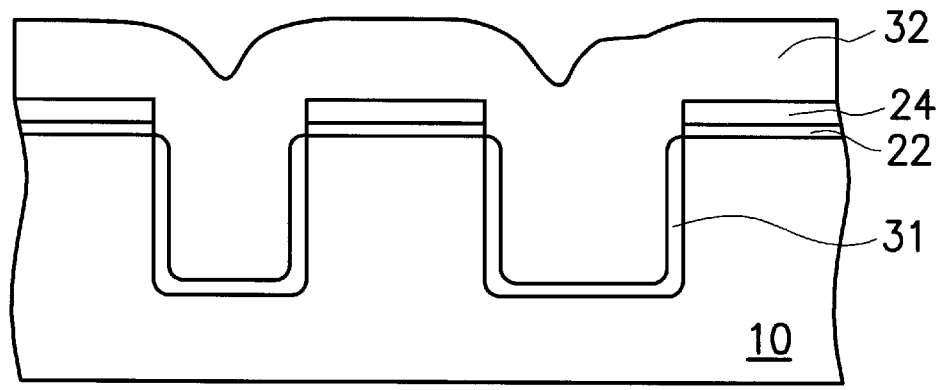
Figure 3:
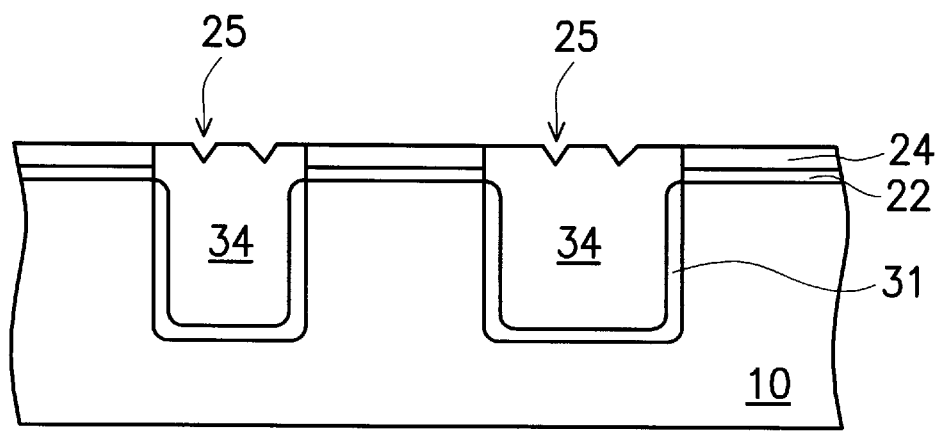
Figure 4:
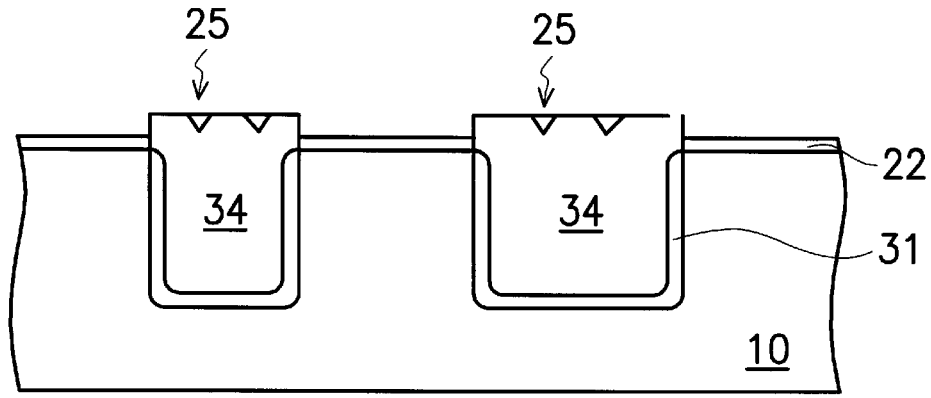
Figure 5:
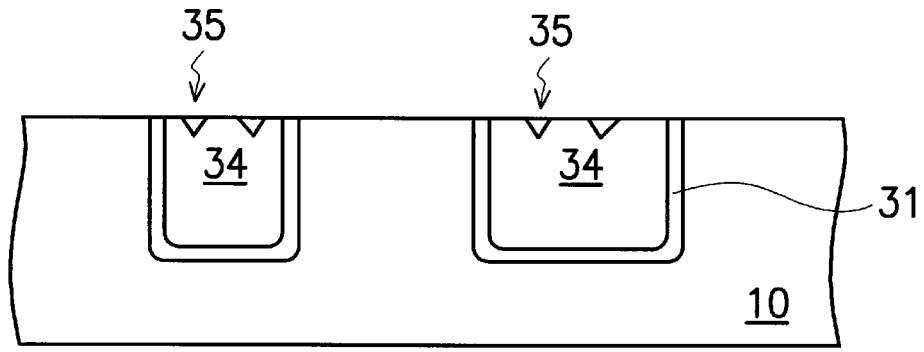
Figure 6:
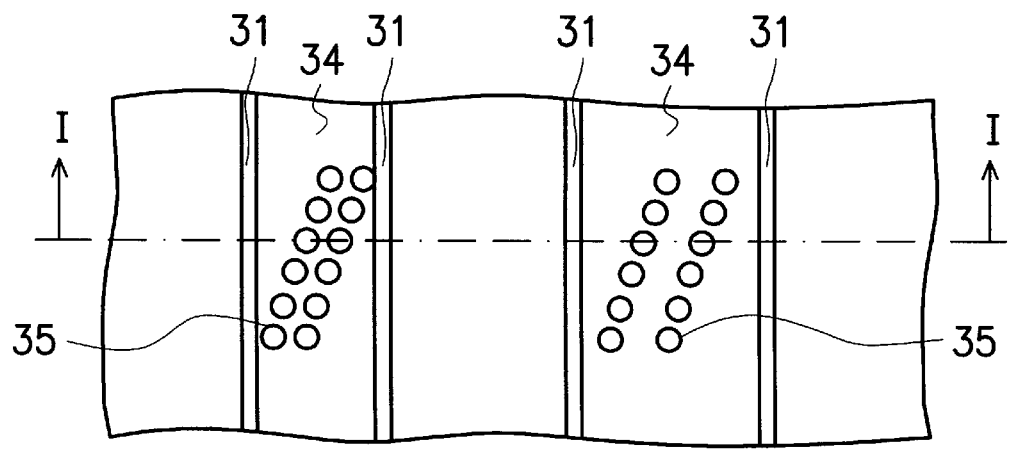
FIG. 6 is a schematic top view of the wafer of FIG. 5.
Figure 7:
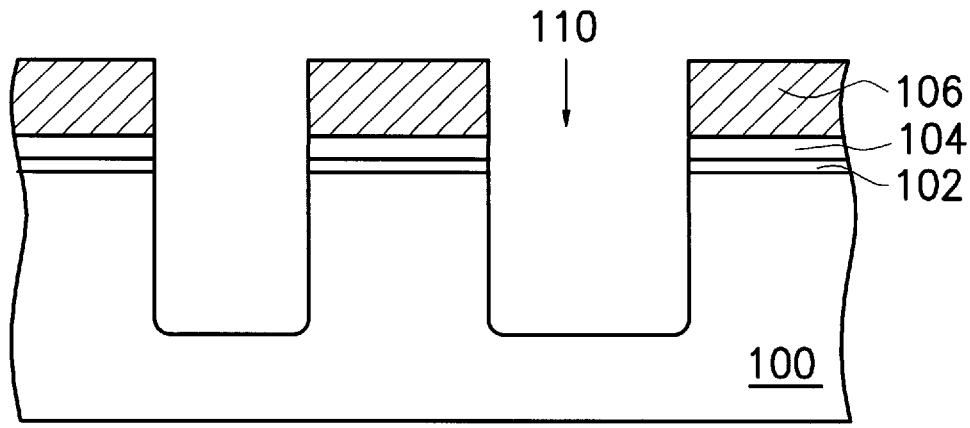
FIGS. 7 through 11 are schematic, cross-sectional diagrams used to depict the steps involved in the method according to the invention for fabricating an STI structure in an integrated circuit.

Referring first to FIG. 7, in the first step, a semiconductor substrate 100, such as a P-type silicon substrate, is prepared. A pad oxide layer 102 is then formed through a thermal oxidation process over the substrate 100 to a thickness of from 50 Å to 500 Å (angstrom) for surface protection of the substrate 100. After this, a mask layer 104 is formed from silicon nitride through a CVD (chemical-vapor deposition) process over the pad oxide layer 102.

Subsequently, a photoresist layer 106 is formed over the mask layer 104, which is then selectively removed through a photolithographic and etching process to expose those regions where shallow trenches are to be formed. Subsequently, with the remaining photoresist layer 106 serving as a mask, an etching process is performed on the wafer, whereby those portions of the mask layer 104, the pad oxide layer 102, and the substrate 100 that are exposed by the photoresist layer 106 are etched away until reaching a predefined, controlled depth of from 2,000 Å to 5,000 Å into the substrate 100. The etching process can be either a dry etching process or a wet etching process, and is preferably an anisotropic etching process. Through this process, a plurality of shallow trenches 110 is formed in the substrate 100.

Figure 8:
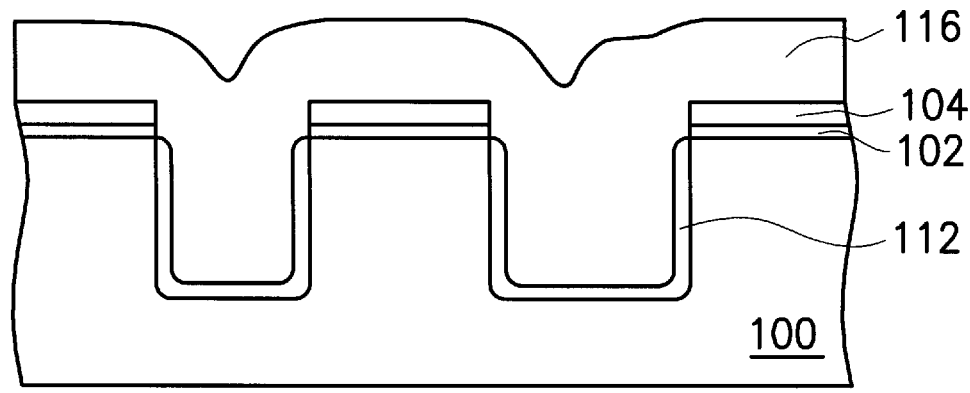

Referring next to FIG. 8, in the subsequent step, the entire photoresist layer 106 is removed through a conventional process. Next, a thermal oxidation process is performed on the wafer, whereby a liner oxide layer 112 is formed over the exposed surfaces of the trenches 110. After this, an oxide layer 116 is formed through a CVD process over the wafer to a thickness above the mask layer 104. Subsequently, the oxide layer 116 undergoes a densification process at a temperature of about 1,000° C. for a duration of from 10 min. to 30 min. (minute).

Figure 9:
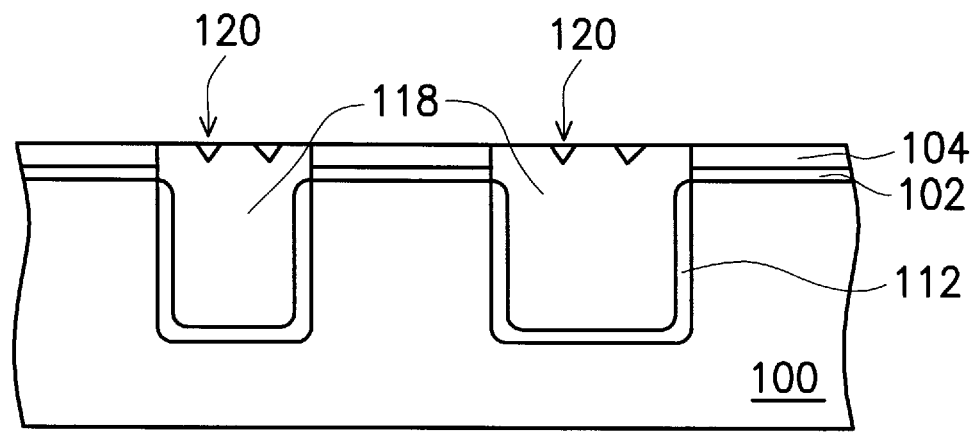

Referring next to FIG. 9, in the subsequent step, a CMP process is performed on the wafer until the mask layer 104 is exposed. Through this process, all the part of the oxide layer 116 that lies above the topmost surface of the mask layer 104 is removed, leaving only the part that is in the trenches 110. The part of the oxide layer 116 remaining after the CMP process serves as oxide plugs in the trenches 110, which are here designated by the reference numeral 118. During the CMP process, however, microscratches 120 form in the top surface of the oxide plugs 118.

Figure 10:
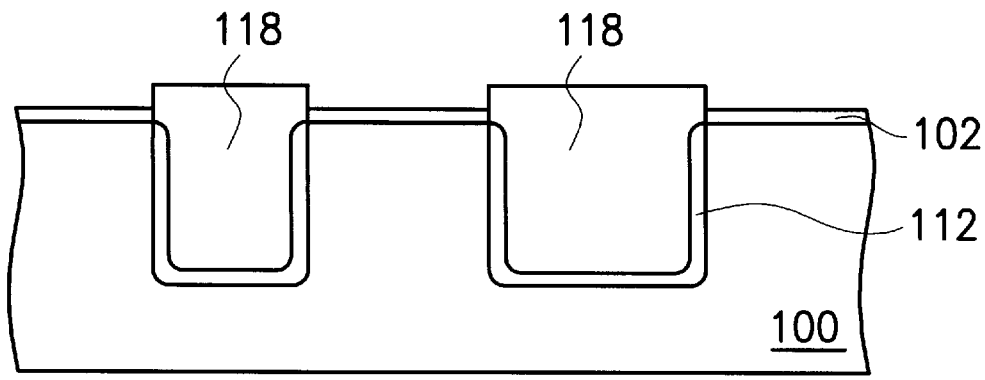

Referring next to FIG. 10, in the subsequent step, a laser annealing process is performed on the top surface of the oxide plugs 118. In the laser annealing process, a laser beam, such as an excimer laser beam, is used to scan over the wafer where microscratches are formed. The laser beam can either scan over the entire top surface of the wafer or over only selected regions within which the oxide plugs 118 are located. The laser beam can heat up the illuminated region to thereby cause the top surface of the oxide plug 118 to be recrystallized but does not cause diffusion such that the microscratches 120 disappear. Since the laser beam is highly confined to a small region, the areas beyond the illuminated regions (i.e., the areas beyond the areas where the oxide plugs 118 are formed) are not affected. Through this laser annealing process, the microscratches 120 in the top surface of the oxide plugs 118 can be removed. After this, the entire mask layer 104 is removed through an etching process using hot phosphoric acid as the etchant.

Figure 11:
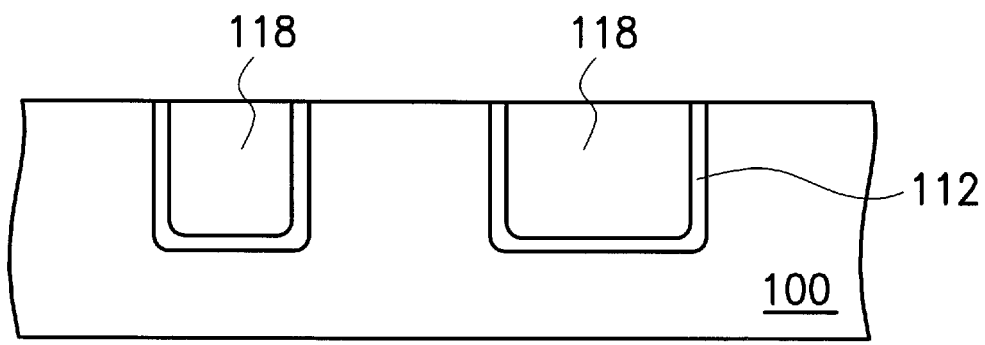
Figure 12:
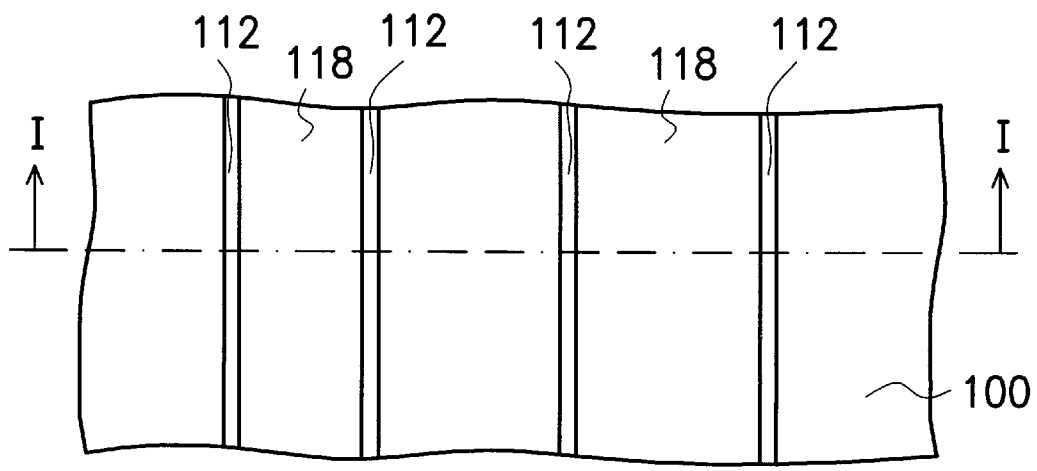
FIG. 12 is a schematic top view of the wafer of FIG. 11.

Referring next to FIG. 11, in the subsequent step, an etching process is performed by submerging the entire wafer in a solution of hydrofluoric acid (HF). The HF solution can etch both the pad oxide layer 102 and the oxide plugs 118, but has a faster etching rate on the oxide plugs 18 than on the pad oxide layer 102. Therefore, when the pad oxide layer 102 is entirely etched away, the topmost surface of the remaining part of the oxide plug 118 is nearly level with the topmost surface of the substrate 100. As illustrated in the top view of FIG. 12, the top surfaces of the oxide plugs 118 are substantially polished with no microscratches formed therein. After this, conventional processes are performed to complete the fabrication of the IC device. These conventional process are not within the spirit and scope of the invention, so description thereof will not be detailed.

In conclusion, the method of the invention is characterized in the use of a laser annealing process to remove the microscratches in the top surface of the oxide plugs that are caused by CMP process. The invention can therefore prevent the occurrence of a bridging effect and short-circuits due to the forming of the microscratches that would otherwise occur in the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an STI structure in an integrated circuit, comprising the steps of:

preparing a semiconductor substrate;

forming a mask layer over the substrate;

removing selected portions of the mask layer and the underlying substrate to form a trench;

forming a liner oxide layer over the exposed surfaces of the trench;

forming an oxide layer over the mask layer, which fills up the trench;

removing part of the oxide layer until the mask layer is exposed, with the remaining part of the oxide layer in the trench serving as an oxide plug;

performing a laser annealing process on the oxide plug; and removing the entire mask layer.

2. The method of claim 1, wherein the mask layer is formed from silicon nitride.

3. The method of claim 1, wherein the step of removing part of the oxide layer is carried out through a CMP process.

4. The method of claim 1, wherein the laser annealing process utilizes an excimer laser beam to scan over the surface of the oxide plug.

5. The method of claim 1, wherein the mask layer is formed through a CVD process.

6. The method of claim 1, wherein the oxide layer is formed through a CVD process.

7. A method for fabricating an STI structure in integrated circuit, comprising the steps of:

preparing a semiconductor substrate;

forming a layer of silicon nitride over the substrate to serve as a mask layer;

removing selected portions of the silicon nitride layer and the underlying substrate to form a trench;

forming a liner oxide layer over the exposed surfaces of the trench;

forming an oxide layer over the silicon nitride layer, which fills the trench;

removing part of the oxide layer until the silicon nitride layer is exposed, with the remaining part of the oxide layer in the trench serving as an oxide plug;

performing a laser annealing process on the oxide plug, and removing the entire silicon nitride layer.

8. The method of claim 7, wherein the step of removing part of the oxide layer is carried out through a CMP process.

9. The method of claim 7, wherein the laser annealing process utilizes an excimer laser beam to scan over the surface of the oxide plug.

10. The method of claim 7, wherein the silicon nitride layer is formed through a CVD process.

11. The method of claim 7, wherein the oxide layer is formed through a CVD process.

* * * * *